(12) United States Patent
Liu

(10) Patent No.: US 11,885,843 B2
(45) Date of Patent: Jan. 30, 2024

(54) METHOD, SYSTEM AND APPARATUS FOR FAULT DETECTION

(71) Applicant: Hitachi Energy Ltd, Zürich (CH)

(72) Inventor: Kai Liu, Beijing (CN)

(73) Assignee: Hitachi Energy Ltd., Zurich (CH)

( * ) Notice: Subject to any disclaimer, the term of this patent is extended or adjusted under 35 U.S.C. 154(b) by 72 days.

(21) Appl. No.: 16/440,258

(22) Filed: Jun. 13, 2019

(65) Prior Publication Data
US 2019/0293705 A1    Sep. 26, 2019

Related U.S. Application Data

(63) Continuation of application No. PCT/CN2017/088474, filed on Jun. 15, 2017.

(51) Int. Cl.
*G01R 31/08*    (2020.01)
(52) U.S. Cl.
CPC ......... *G01R 31/088* (2013.01); *G01R 31/085* (2013.01); *G01R 31/086* (2013.01)
(58) Field of Classification Search
CPC .. G01R 31/088; G01R 31/085; G01R 31/086; G01R 1/00; G01R 3/00; G01R 15/00;
(Continued)

(56) References Cited

U.S. PATENT DOCUMENTS

| 6,601,001 | B1 * | 7/2003 | Moore | G01R 31/08 |
| | | | | 702/58 |
| 2013/0035882 | A1 | 2/2013 | Wahlroos et al. | |

(Continued)

FOREIGN PATENT DOCUMENTS

| CN | 1261672 A | 8/2000 |
| CN | 1753267 A | 3/2006 |

(Continued)

OTHER PUBLICATIONS

Liu et al (Method, System and Apparatus for Fault Detection in Line Protection for Power Transmission System) Apr. 14, 2016 (Year: 2016).*

(Continued)

*Primary Examiner* — Farhana A Hoque
*Assistant Examiner* — Joseph O Nyamogo
(74) *Attorney, Agent, or Firm* — Slater Matsil, LLP

(57) ABSTRACT

A method, system and apparatus for fault detection in line protection for a power transmission system. The method includes: obtaining a sampled value of voltage at a measurement point, at which a protection device for the line protection is installed, on an electrical line; obtaining a sampled value of current at the measurement point; calculating an instantaneous measurement point voltage value specified by operation criterion of a protection device from the sampled value of voltage at the measurement point and the sampled value of current at the measurement point by using measurement differential equation according to a time domain lumped parameter model for the electrical line; calculating an instantaneous comparison voltage value specified by operation criterion of a protection device from the sampled value of voltage at the measurement point and the sampled value of current at the measurement point by using comparison differential equation according to a time domain lumped parameter model for the electrical line; and performing the fault detection based on the comparison result of the instantaneous measurement point voltage value and the instantaneous comparison voltage value. The method transfers the distance relay to the format of voltage comparison, calculate the voltage using differential equation instead of vector, and compare the amplitude of calculated voltages. It designs a time-domain distance protection which (Continued)

has strong ability to resist DC components and harmonics including high frequency harmonic and low frequency harmonic.

20 Claims, 6 Drawing Sheets

(58) Field of Classification Search
CPC ........ G01R 19/00; G01R 21/00; G01R 22/00; G01R 27/00; G01R 29/00; G01R 31/00; G01R 33/00; G01R 35/00; G01B 5/00; G01B 7/00; G01B 17/00; G01B 21/00; G01D 3/00; G01D 5/00; G01H 9/00; G01H 11/00; G01J 1/00; G01J 3/00; G01J 5/00; G01K 1/00; G01K 3/00; G01K 5/00; G01K 7/00; G01K 11/00; G01K 15/00; G01K 2219/00; G01L 1/00; G01L 5/00; G01L 9/00; G01L 21/00; G01M 3/00; G01M 5/00; G01M 13/00; G01M 15/00; G01N 2291/00; G01N 3/00; G01N 5/00; G01N 9/00; G01N 17/00; G01N 21/00; G01N 22/00; G01N 23/00; G01N 24/00; G01N 25/00; G01N 27/00; G01N 29/00; G01N 31/00; G01N 33/00; G01N 2021/00; G01P 3/00; G01Q 10/00; G01Q 60/00; G01Q 70/00; G01S 5/00; G01S 13/00; G01V 3/00; G02B 1/00; G02B 6/00; G02B 2006/00; G02F 1/00; G02F 2/00; G02F 2001/00; G02F 2201/00; G02F 2202/00; G02F 2203/00; G03G 15/00; G03H 1/00; G03H 2001/00; G03H 2226/00; G04F 5/00; G05D 23/00; G05F 3/00; G06F 1/00; G06F 3/00; G06F 17/00; G06K 7/00; G06K 9/00; G06N 3/00; G06N 10/00; G06N 20/00; G06Q 10/00; G06T 5/00; G06T 7/00; G06T 11/00; G06T 2207/00; G06T 2211/00; G07C 9/00; G08B 17/00; G08B 21/00; G08B 29/00; G09G 3/00; G09G 2300/00; G09G 2320/00; G09G 2330/00; G09G 2360/00; G09G 2370/00; G11B 9/00; G11C 11/00; G11C 13/00; G11C 29/00; G21K 1/00; G16H 30/00; G16H 50/00; H02H 3/083; H02H 7/265; H02H 1/0007; H02H 1/0092; H02H 1/00; H02H 7/00; H02H 3/00; H04B 3/46; H04B 3/00; H04B 10/00; H04B 17/00; H01B 3/00; H01F 1/00; H01F 17/00; H01F 27/00; H01F 2017/00; H01F 2021/00; H01L 29/00; H01L 21/00; H01L 22/00; H01L 23/00; H01L 24/00; H01L 25/00; H01L 27/00; H01L 31/00; H01L 33/00; H01L 41/00; H01L 43/00; H01L 45/00; H01L 49/00; H01L 51/00; H01L 2223/00; H01L 2224/00; H01L 2225/00; H01L 2251/00; H01L 2924/00; H01L 2933/00; H01H 1/00; H01H 2001/00; H01H 2009/00; H01P 1/00; H01P 3/00; H01P 7/00; H01P 11/00; H01Q 1/00; H01Q 3/00; H01Q 9/00; H01Q 15/00; H01Q 17/00; H01Q 21/00; H01Q 25/00; H01R 4/00; H01R 9/00; H01R 12/00; H01S 3/00; H02J 1/00; H02J 3/00; H02J 4/00; H02J 13/00; H02M 1/00; H02M 3/00; H02M 7/00; H02M 2001/00; H02M 2003/00; H02P 5/00; H03B 5/00; H03B 17/00; H03B 19/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00; H03J 2200/00; H03K 3/00; H03K 17/00; H03K 19/00; H03L 7/00; H03L 2207/00; H03M 1/00; H04L 27/00; H04N 5/00; H04N 7/00; H04R 3/00; H04R 29/00; H04W 24/00; H05B 33/00; H05B 45/00; H05B 47/10; H05H 3/00; H05K 1/00; H05K 2201/00; H05K 3/00; H05K 7/00

See application file for complete search history.

(56) References Cited

U.S. PATENT DOCUMENTS

| 2013/0107405 | A1* | 5/2013 | Blumschein | H02H 7/26 |
| --- | --- | --- | --- | --- |
| | | | | 702/58 |
| 2017/0082675 | A1 | 3/2017 | Schweitzer, III et al. | |
| 2020/0350760 | A1 | 11/2020 | Schweitzer, III et al. | |

FOREIGN PATENT DOCUMENTS

| CN | 101242094 A | 8/2008 | |
| --- | --- | --- | --- |
| CN | 102985836 A | 3/2013 | |
| CN | 103245887 A | 8/2013 | |
| CN | 103326335 A | 9/2013 | |
| CN | 103606906 A | 2/2014 | |
| CN | 106199328 A | 12/2016 | |
| CN | 106796257 A | 5/2017 | |
| WO | 2016044469 A1 | 3/2016 | |
| WO | 2017049224 A1 | 3/2017 | |
| WO | WO-2017177424 A1 * | 10/2017 | ........... H02H 1/0007 |

OTHER PUBLICATIONS

Terzija, Preston, Stanojević Elkalashy, and Popov (Synchronized Measurements-Based Algorithm for Short Transmission Line Fault Analysis; Nov. 2015) (Year: 2015).*
Jiankang Zhang, Jiale Suonan, Zaibin Jiao, Guobing Song (A Fast Full-line Tripping Distance Protection Method for HVDC Transmission Line; 2012 IEEE) (Year: 2012).*
Intellectual Property Office of the P.R. China, International Search Report & Written Opinion issued in corresponding Application No. PCT/CN2017/088474, dated Mar. 16, 2018, 9 pp.
Blumschein et al., "Directional Comparison based on High-Speed-Distance Protection using Delta Quantities," Siemens AG, Infrastructure & Cities Sector, 7 pp.
Nimmersjö et al., "A New Approach to High Speed Relaying Based on Transient Phenomena," ABB Relays AB, Sweden, pp. 140-145.
Schweitzer, III et al., "Speed of Line Protection—Can We Break Free of Phasor Limitations," Schweitzer Engineering Laboratories, Inc., 2014, 14 pp.
RCS931 line differential protection technical manual, NARI, including English machine translation of Section 3.4 Power frequency variation distance relay, 73 pp.
Dineshkumar, G., et al., "A Two Stage Fault Location Algorithm for Locating Faults on Transmission Lines", International Conference on Computation of Power, Energy, Information and Communication (ICCPEIC), Apr. 17-18, 2013, 6 pages.

* cited by examiner

METHOD, SYSTEM AND APPARATUS FOR FAULT DETECTION

TECHNICAL FIELD

The present application relates to a method, system and apparatus for fault detection in line protection for a power transmission system.

BACKGROUND ART

Distance protection is one of line protection technologies, which could determine a distance between a fault point and a point at which a protection device is installed and the time for actions based on the determined distance. The distance protection is one of the most important protections for extra/ultra-high voltage (EHV/UHV) transmission line systems for both technical and business reasons. For line distance protection, the fast operation is one of the most important features and it is also one of the most important requirements of customers. Fault detection is a key technology for the line distance protection since it is a main criterion triggering the distance protection.

However, the distance protection of prior art may maloperate because of harmonics.

For example, as to the quadrilateral type, it usually calculates the impedance by $$Z = \frac{\dot{U}}{\dot{I}} \quad (1)$$

As to the Mho type, the corresponding equation can be expressed as $$\theta_1 < \arg\frac{\dot{U}_{op}}{\dot{U}_p} < \theta_2 \quad (2)$$

For the implement of these two types, the vectors $\dot{U}$ and $\dot{I}$ are calculated first, then the impedance Z or the angle $$\arg\frac{\dot{U}_{op}}{\dot{U}_p}$$

is calculated, and then it is to determine whether the impedance Z or the angle $$\arg\frac{\dot{U}_{op}}{\dot{U}_p}$$

meets the operation criterion of the distance relay.

Usually, the Fourier algorithm is used to calculate the vectors.

However, when a fault occurs in the line, there are abundant high frequency components and decay DC components, and the accuracy of calculated vector is influenced. Especially when the distance relay is used in the series-compensated line, besides high frequency components and DC components, there are low frequency components which bring serious trouble to distance protection. The distance protection may overreach because of low frequency components.

FIG. 12 shows the simulation when an external fault occurs in the parallel lines, and both lines are with series compensated line. The simulation results show that the distance protection of prior art may overreach because of external faults.

SUMMARY

Accordingly, one aspect of the present invention provides a method for fault detection in line protection for power transmission system, comprising the following steps:

obtaining a sampled value of voltage at a measurement point, at which a protection device for the line protection is installed, on an electrical line;

obtaining a sampled value of current at a measurement point;

calculating an instantaneous measurement point voltage value specified by operation criterion of a protection device from the sampled value of voltage at the measurement point and the sampled value of current at the measurement point by using measurement differential equation according to a time domain lumped parameter model for the electrical line;

calculating an instantaneous comparison voltage value specified by operation criterion of a protection device from the sampled value of voltage at the measurement point and the sampled value of current at the measurement point using comparison differential equation according to a time domain lumped parameter model for the electrical line; and performing the fault detection based on the comparison result of the instantaneous measurement point voltage value and the instantaneous comparison voltage value.

Preferably:

the instantaneous measurement point voltage value is calculated by:

$$u_{q\_k} = m_1 \cdot u_k + m_2 \cdot \left(R \cdot i_k + L \cdot \frac{di_k}{dt}\right)$$

wherein $u_{q\_k}$ represents the instantaneous measurement point voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the differential value of the current $i_k$, $m_1$ and $m_2$ are coefficients specified by operation criterion of a protection device.

Preferably:

the instantaneous comparison voltage value is calculated by:

$$u_{res\_k} = m_3 \cdot u_k + m_4 \cdot \left(R \cdot i_k + L \cdot \frac{di_k}{dt}\right)$$

wherein $u_{res\_k}$ represents the instantaneous comparison voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the differential value of the sampled value of current $i_k$ at instant k, $m_3$ and $m_4$ are coefficients specified by operation criterion of a protection device.

Preferably:
the instantaneous measurement point voltage value is calculated by:

$$\begin{cases} u_{q\_p1p2\_k} = u_{p1p2\_k} - \left(R \cdot i_{p1p2\_k} + L \cdot \frac{di_{p1p2\_k}}{dt}\right) \\ u_{q\_p1\_k} = u_{p1\_k} - \left[R \cdot (i_{p1\_k} + k_R \cdot 3i_{0\_k}) + L \cdot \frac{i_{p1\_k} + k_L \cdot 3i_{0\_k}}{dt}\right] \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$ respectively represents the sampled voltage and sampled current between phase p1 and phase p2 at the measurement point at instant k, $u_{p1\_k}$, $i_{p1\_k}$ respectively represents the sampled voltage and sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k}+k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Preferably:
the instantaneous comparison voltage value is calculated by:

$$\begin{cases} u_{res\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{res\_p1p2\_k}$ represents the instantaneous comparison voltage value between phase p1 and phase p2 at instant k, $i_{p1p2\_k}$ represents the sampled current between phase p1 and phase p2 at the measurement point at instant k, $i_{p1\_k}$ represents the sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k}+k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Preferably:
the lumped parameter model comprises any of a Resistor-Inductor-Capacitor (RLC) model or a Resistor-Inductor (RL) model.

Another aspect of the present invention provides a computer program comprising computer program code adapted to perform all of the steps of any one of the above when running on a computer.

A further aspect of the present invention provides a computer program according to the above, embodied on a computer-readable medium.

Another aspect of the present invention provides a system for fault detection in line protection for power transmission system, comprising:
one or more processors;
a memory coupled to at least one of the processors; and
a set of program instructions stored in the memory and executable by at least one of the processors to cause the system to:
obtaining a sampled value of voltage at a measurement point, at which a protection device for the line protection is installed, on an electrical line;
obtaining a sampled value of current at a measurement point;
calculating an instantaneous measurement point voltage value specified by operation criterion of a protection device from the sampled value of voltage at the measurement point and the sampled value of current at the measurement point by using measurement differential equation according to a time domain lumped parameter model for the electrical line;

calculating an instantaneous comparison voltage value specified by operation criterion of a protection device from the sampled value of voltage at the measurement point and the sampled value of current at the measurement point by using comparison differential equation according to a time domain lumped parameter model for the electrical line; and performing the fault detection based on the comparison result of the instantaneous measurement point voltage value and the instantaneous comparison voltage value.

Preferably:

the instantaneous measurement point voltage value is calculated by:

$$u_{q\_k} = m_1 \cdot u_k + m_2 \cdot \left( R \cdot i_k + L \cdot \frac{di_k}{dt} \right)$$

wherein $u_{q\_k}$ represents the instantaneous measurement point voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the differential value of the current $i_k$, $m_1$ and $m_2$ are coefficients specified by operation criterion of a protection device.

Preferably:

the instantaneous comparison voltage value is calculated by:

$$u_{res\_k} = m_3 \cdot u_k + m_4 \cdot \left( R \cdot i_k + L \cdot \frac{di_k}{dt} \right)$$

wherein $u_{res\_k}$ represents the instantaneous comparison voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents me differential value of the sampled value of current $i_k$ at instant k, $m_3$ and $m_4$ are coefficients specified by operation criterion of a protection device.

Preferably:

the instantaneous measurement point voltage value is calculated by:

$$\begin{cases} u_{q\_p1p2\_k} = u_{p1p2\_k} - \left( R \cdot i_{p1p2\_k} + L \cdot \frac{di_{p1p2\_k}}{dt} \right) \\ u_{q\_p1\_k} = u_{p1\_k} - \left[ R \cdot (i_{p1\_k} + k_R \cdot 3i_{0\_k}) + L \cdot \frac{d(i_{p1\_k} + k_L \cdot 3i_{0\_k})}{dt} \right] \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$ respectively represents the sampled voltage and sampled current between phase p1 and phase p2 at the measurement point at instant k, $u_{p1\_k}$, $i_{p1\_k}$ respectively represents the sampled voltage and sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k}+k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Preferably:

the instantaneous comparison voltage value is calculated by:

$$\begin{cases} u_{res\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{res\_p1p2\_k}$ represents the instantaneous comparison voltage value between phase p1 and phase p2 at instant k, $i_{p1p2\_k}$ represents the sampled current between phase p1 and phase p2 at the measurement point at instant k, $i_{p1\_k}$ represents the sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k}+k_L\cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Preferably:
the lumped parameter model comprises any of a Resistor-Inductor-Capacitor (RLC) model or a Resistor-Inductor (RL) model.

Another aspect of the present invention provides an apparatus for fault detection in line protection for a power transmission system, comprising:
  a sample voltage obtainment module, configured to obtain a sampled value of voltage at a measurement point, at which a protection device for the line protection is installed, on an electrical line;
  a sample current obtainment module, configured to obtain a sampled value of current at a measurement point;
  an instantaneous measurement point voltage calculation module, configured to calculate an instantaneous measurement point voltage value specified by operation criterion of a protection device from the sampled value of voltage at the measurement point and the sampled value of current at the measurement point by using measurement differential equation according to a time domain lumped parameter model for the electrical line;
  an instantaneous comparison voltage calculation module, configured to calculate an instantaneous comparison voltage value specified by operation criterion of a protection device from the sampled value of voltage at the measurement point and the sampled value of current at the measurement point by using comparison differential equation according to a time domain lumped parameter model for the electrical line; and
  a fault detection module, configured to perform the fault detection based on the comparison result of the instantaneous measurement point voltage value and the instantaneous comparison voltage value.

Preferably:
the instantaneous measurement point voltage value is calculated by:

$$u_{q\_k} = m_1 \cdot u_k + m_2 \cdot \left(R \cdot i_k + L \cdot \frac{di_k}{dt}\right)$$

wherein $u_{q\_k}$ represents the instantaneous measurement point voltage value at instant k, $u_k$ represents the sampled value of voltage at measurement point at instant k, $i_k$ represents the sampled value of current at instant k, R represents a resistance value of a resistor in the lumped parameter model, L represents an inductance value of an inductor in the lumped parameter model, and $$\frac{di_k}{dt}$$

represents the differential value of the current $i_k$, $m_1$ and $m_2$ are coefficients specified by operation criterion of a protection device.

Preferably:
the instantaneous comparison voltage value is calculated by:

$$u_{res\_k} = m_3 \cdot u_k + m_4 \cdot \left(R \cdot i_k + L \cdot \frac{di_k}{dt}\right)$$

wherein $u_{res\_k}$ represents the instantaneous comparison voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the differential value of the sampled value of current $i_k$ at instant k, $m_3$ and $m_4$ are coefficients specified by operation criterion of a protection device.

Preferably:
the instantaneous measurement point voltage value is calculated by:

$$\begin{cases} u_{q\_p1p2\_k} = u_{p1p2\_k} - \left(R \cdot i_{p1p2\_k} + L \cdot \frac{di_{p1p2\_k}}{dt}\right) \\ u_{q\_p1\_k} = u_{p1\_k} - \left[R \cdot (i_{p1\_k} + k_R \cdot 3i_{0\_k}) + L \cdot \frac{d(i_{p1\_k} + k_L \cdot 3i_{0\_k})}{dt}\right] \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$ respectively represents the sampled voltage and sampled current between phase p1 and phase p2 at the measurement point at instant k, $u_{p1\_k}$, $i_{p1\_k}$ respectively represents the sampled voltage and sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k}+k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Preferably:
the instantaneous comparison voltage value is calculated by:

$$\begin{cases} u_{ress\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$

wherein p and p2 respectively represents different phase of the three-phase transmission line, $u_{res\_p1p2\_k}$ represents the instantaneous comparison voltage value between phase p1 and phase p2 at instant k, $i_{p1p2\_k}$ represents the sampled current between phase p1 and phase p2 at the measurement point at instant k, $i_{p1\_k}$ represents the sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k}+k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Preferably:
the lumped parameter model comprises any of a Resistor-Inductor-Capacitor (RLC) model or a Resistor-Inductor (RL) model.

The present invention transfer the distance relay to the format of voltage comparison, calculate the voltage using differential equation instead of vector, and compare the amplitude of calculated voltages. It designs a time-domain distance protection which has strong ability to resist DC components and harmonics including high frequency harmonic and low frequency harmonic.

DETAILED DESCRIPTION OF THE EMBODIMENTS

Hereinafter, the present invention is further described in detail by the way of the particular embodiments in combination with the figures.

Figure 1:
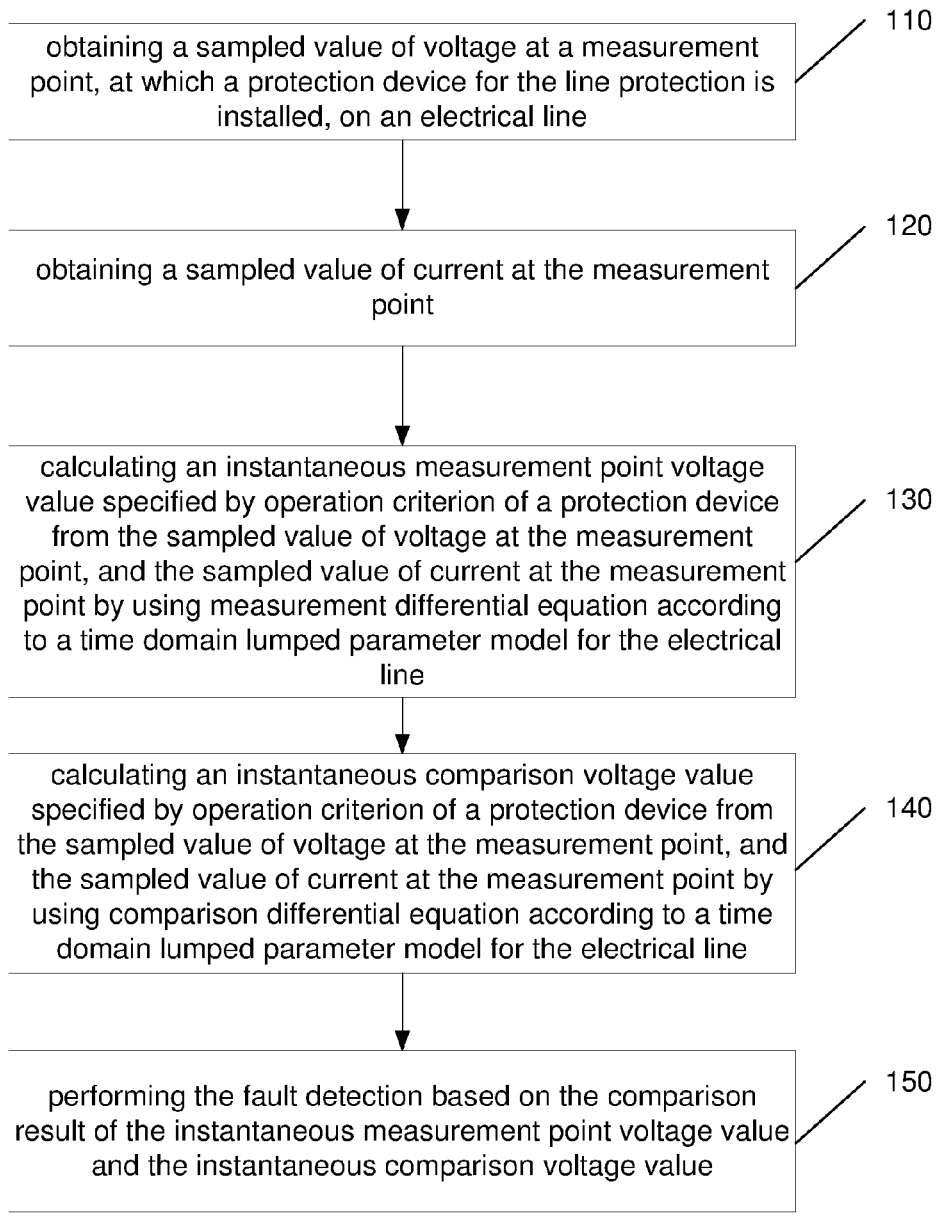
FIG. 1 shows a flow-process diagram illustrating a method for fault detection in line protection for power transmission system.

FIG. 1 shows a flow-process diagram illustrating a method for fault detection in line protection for power transmission system, comprising the following steps:

step 110, obtaining a sampled value of voltage at a measurement point, at which a protection device for the line protection is installed, on an electrical line;

step 120, obtaining a sampled value of current at the measurement point;

step 130, calculating an instantaneous measurement point voltage value specified by operation criterion of a protection device from the sampled value of voltage at the measurement point, and the sampled value of current at the measurement point by using measurement differential equation according to a time domain lumped parameter model for the electrical line;

step 140, calculating an instantaneous comparison voltage value specified by operation criterion of a protection device from the sampled value of voltage at the measurement point, and the sampled value of current at the measurement point by using comparison differential equation according to a time domain lumped parameter model for the electrical line; and step 150, performing the fault detection based on the comparison result of the instantaneous measurement point voltage value and the instantaneous comparison voltage value.

A MHO distance protection is used to describe the implementation steps of the present invention. In order to simplify the illustration, a typical MHO relay is used as follows:

$$270° > \arg\frac{\dot{U}}{\dot{U}-Z_{set}\cdot \dot{I}} > 90° \qquad (3)$$

Wherein $\dot{U}$ is a voltage vector at a measurement point, $\dot{I}$ is current vector at a measurement point, the value of $\dot{U}-Z_{set}\cdot\dot{I}$ is the comparison voltage value specified by operation criterion of MHO distance protection, and $Z_{set}$ is the impedance of the protection zone.

The equation (3) is translated to the format of voltage comparison. And the step 110 and step 120 are performed to obtain the sampled value of voltage and current at the measurement point. And the step 130 and step 140 are performed to calculate the instantaneous measurement point voltage value and instantaneous comparison voltage value by using differential equation instead of vector. Then the step 150 is performed to compare the amplitude of voltages calculated in steps 130 and 140. If the comparison result meets the time domain operation criterion of MHO distance protection, then the fault operation is performed.

In the present invention the distance relay is transferred to the format of voltage comparison, the voltage is calculated by using differential equation instead of vector, and the amplitude of calculated voltages are compared. A time-domain distance protection is designed, which has strong ability to resist DC components and harmonics including high frequency harmonic and low frequency harmonic.

In one embodiment:
the instantaneous measurement point voltage value is calculating by:

$$u_{q\_k} = m_1 \cdot u_k + m_2 \cdot \left(R \cdot i_k + L \cdot \frac{di_k}{dt}\right)$$

wherein $u_{q\_k}$ represents the instantaneous measurement point voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the differential value of the current $i_k$ $m_1$ and $m_2$ are coefficients specified by operation criterion of a protection device.

All the operation criterion can transfer as a comparison of $|m_1\cdot\dot{U}+m_2\cdot Z_1\cdot\dot{I}|$ and $|m_3\cdot\dot{U}+m_4\cdot Z_2\cdot\dot{I}|$, wherein $m_1$, $m_2$, $m_3$, and $m_4$ are coefficients specified by operation criterion of a protection device, $Z_1$ and $Z_2$ are impedances specified by operation criterion of a protection device, $\dot{U}$ is voltage vector at the measurement point and $\dot{I}$ is current vector at the measurement point.

The coefficients and impedances are different for different operation criterion.

For equation (3), it can transfer to:

$$|\dot{U}-Z_{set}\cdot\dot{I}/2|<|Z_{set}\cdot\dot{I}/2| \qquad (4)$$

Wherein, $|\dot{U}-Z_{set}\cdot\dot{I}/2|$ can transfer from $|m_1\cdot\dot{U}+m_2\cdot Z_1\cdot\dot{I}|$ and $|Z_{set}\cdot\dot{I}/2|$ can transfer from $|m_3\cdot\dot{U}+m_4\cdot Z_2\cdot\dot{I}|$ when $m_1=1$, $m_2=-1$, $m_3=0$, $m_4=1$, $Z_1=Z_{set}/2$, $Z_2=Z_{set}/2$.

For a more general expression of MHO distance relay, corresponding criterion is:

$$\left|\dot{U}-\frac{Z_{set}-Z_P}{2}\cdot\dot{I}\right|<\left|\frac{Z_{set}-Z_P}{2}\cdot\dot{I}\right|,$$

wherein $$\left|\dot{U}-\frac{Z_{set}-Z_P}{2}\cdot\dot{I}\right|$$

can transfer from $|m_1\cdot\dot{U}+m_2\cdot Z_1\cdot\dot{I}|$ and $$\left|\frac{Z_{set}-Z_P}{2}\cdot\dot{I}\right|$$

can transfer from $|m_3\cdot\dot{U}+m_4\cdot Z_2\cdot\dot{I}|$ when $m_1=1$, $m_2=-1$, $m_3=0$, $m_4=1$, $$Z_1 = \frac{Z_{set}-Z_P}{2}, Z_2 = \frac{Z_{set}-Z_P}{2}.$$

Other operation criterions can also transfer from $|m_1\cdot\dot{U}+m_2\cdot Z_1\cdot\dot{I}|$ and $|m_3\cdot\dot{U}+m_4\cdot Z_2\cdot\dot{I}|$.

A MHO distance protection is used to describe the implementation steps, where $m_1=1$ and $m_2=-1$.

In order to avoid vector calculation, firstly, transfer the equation (3) to equation (4)

The equation above can be expressed as:

$$|\dot{U}-Z\cdot\dot{I}|<|Z\cdot\dot{I}| \qquad (5)$$

In which $$Z = \frac{Z_{set}}{2}.$$

Equation (5) can be expressed to be a general equation as follows:

$$|\dot{U}_q|<|\dot{U}_{res}| \qquad (6)$$

In which $\dot{U}_q=\dot{U}-Z,\dot{U}_{res}=Z\cdot\dot{I}$.

Figure 2:
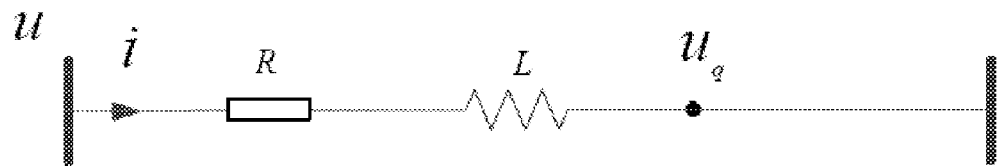
FIG. 2 shows a line model.

FIG. 2 shows a line model. It should be pointed out that this model is only used to describe how to get the differential result of equation (5).

From FIG. 2 it can be known that:

$$\begin{cases} \dot{U}_q = \dot{U}-Z\cdot\dot{I} \\ \dot{U}_{res} = Z\cdot\dot{I} \end{cases} \qquad (7)$$

As FIG. 2 shows, $\dot{U}_q$ is the voltage at point q, while $\dot{U}_{res}$ is the voltage on the impedance Z, which includes a resistor and an inductor.

The impedance of the protection zone is: $Z_{set}=R+jL$. So $\dot{U}_q$ is calculated by using differential equation instead of vector as follows:

$$u_{q\_k} = u_k - R \cdot i_k - L \cdot \frac{di_k}{dt} \quad (8)$$

In which, $u_k$, $i_k$ are sampled values of the voltage and current at a fault location, $u_{q\_k}$ is the instantaneous value calculated.

$$u_{q\_k} = u_k - R \cdot i_k - L \cdot \frac{di_k}{dt}$$

is the measurement differential equation for a typical MHO relay. Clearly, we can also implement the measurement differential equation of the other type distance relay, since all the measurement differential equation can transfer from the unified equation: $|m_3 \cdot \dot{U} + m_4 \cdot Z_2 \cdot \dot{I}|$.

In one embodiment:
the instantaneous comparison voltage value is calculated by:

$$u_{res\_k} = m_3 \cdot u_k + m_4 \cdot \left(R \cdot i_k + L \cdot \frac{di_k}{dt}\right)$$

wherein $u_{res\_k}$ represents the instantaneous comparison voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the differential value of the sampled value of current $i_k$ at instant k, $m_3$ and $m_4$ are coefficients specified by operation criterion of a protection device.

A MHO distance protection is used to describe the implementation steps, where $m_3=0$ and $m_4=1$.

As FIG. 2 shows, $\dot{U}_q$ is the voltage at point q, while $\dot{U}_{res}$ is the voltage on the impedance Z, which includes a resistor and an inductor.

$\dot{U}_{res}$ is calculated by using a differential equation instead of a vector as follow:

$$u_{res\_k} = R \cdot i_k + L \cdot \frac{di_k}{dt}$$

In which, $u_k$, $i_k$ are sampled values of the voltage and current at a fault location, $u_{q\_k}$ is the instantaneous value calculated.

$$u_{res\_k} = R \cdot i_k + L \cdot \frac{di_k}{dt}$$

is the comparison differential equation for a typical MHO relay. Clearly, we can also implement the comparison differential equation of the other type distance relay, since all the comparison differential equation can transfer from the unified equation: $|m_1 \cdot \dot{U} + m_2 \cdot Z_1 \cdot \dot{I}|$.

In one embodiment:
the instantaneous measurement point voltage value is calculated by:

$$\begin{cases} u_{q\_p1p2\_k} = u_{p1p2\_k} - \left(R \cdot i_{p1p2\_k} + L \cdot \frac{di_{p1p2\_k}}{dt}\right) \\ u_{q\_p1\_k} = u_{p1\_k} - \left[R \cdot (i_{p1\_k} + k_R \cdot 3i_{0\_k}) + L \cdot \frac{d(i_{p1\_k} + k_L \cdot 3i_{0\_k})}{dt}\right] \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$ respectively represents the sampled voltage and sampled current between phase p1 and phase p2 at the measurement point at instant k, $u_{p1\_k}$, $i_{p1\_k}$ respectively represents the sampled voltage and sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k}+k_L \cdot 3i_{0\_k}$, R0 represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Figure 3:
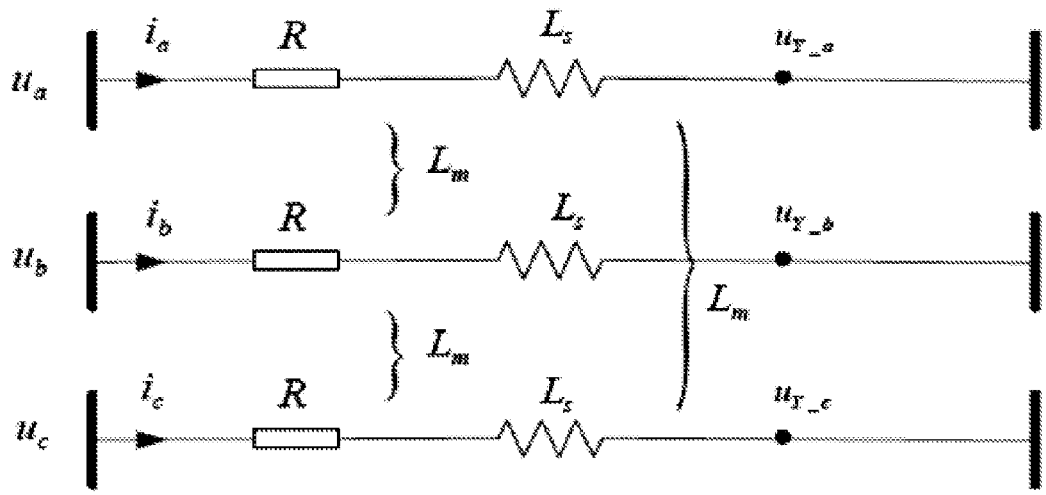
FIG. 3 shows a 3-phases system.

FIG. 3 shows a 3-phases system. It should be pointed out that this model is only used to describe how to get the differential result of equation (5) in 3-phases system.

Since p1 and p2 can be one of the phases A, B, and C. There are six-loop voltages needed to be calculated, includes: $u_{q\_AB\_k}$, $u_{q\_BC\_k}$, $u_{q\_CA\_k}$, $u_{q\_B\_k}$, and $u_{q\_C\_k}$.

Wherein $u_{q\_AB\_k}$, $u_{q\_BC\_k}$, $u_{q\_CA\_k}$ respectively represents the instantaneous measurement point voltage value between phase A and phase B, phase B and C, and phase C and A, at instant k. $u_{q\_A\_k}$, $u_{q\_B\_k}$, and $u_{q\_C\_k}$ respectively represents the instantaneous measurement point voltage value of phase A, B, and C, at instant k.

With the three-line diagram, voltages $u_{q\_A\_k}$, $u_{q\_B\_k}$ and $u_{q\_C\_k}$ may be determined based on equation (8) by further taking mutual inductance between phases into consideration.

For example, voltages $u_{q\_A\_k}$, $u_{q\_B\_k}$, and $u_{q\_C\_k}$ can be determined based on the differential equation such as:

$$\begin{cases} u_{q\_A\_k} = u_{A\_k} - \left(R \cdot i_{A\_k} + L_s \cdot \dfrac{di_{A\_k}}{dt} + L_m \cdot \dfrac{di_{B\_k}}{dt} + L_m \cdot \dfrac{di_{C\_k}}{dt}\right) \\ u_{q\_B\_k} = u_{B\_k} - \left(R \cdot i_{B\_k} + L_s \cdot \dfrac{di_{B\_k}}{dt} + L_m \cdot \dfrac{di_{A\_k}}{dt} + L_m \cdot \dfrac{di_{C\_k}}{dt}\right) \\ u_{q\_C\_k} = u_{C\_k} - \left(R \cdot i_{C\_k} + L_s \cdot \dfrac{di_{C\_k}}{dt} + L_m \cdot \dfrac{di_{A\_k}}{dt} + L_m \cdot \dfrac{di_{B\_k}}{dt}\right) \end{cases} \quad (9)$$

wherein $u_{A\_k}$, $u_{B\_k}$ and $u_{C\_k}$ respectively represents line voltages for phase A, phase B and phase C at the measurement point, at instant k; $i_{A\_k}$, $i_{B\_k}$ and $i_{C\_k}$ respectively represents currents for phase A, phase B and phase C at the measurement point, at instant k; $L_s$ represents the phase inductance for phase A, phase B and phase C; and $L_m$ represents the inductance between phases for phase A, phase B and phase C.

Since the phase to phase voltage is a voltage difference between one phase and another phase, thus the phase-to-phase voltages $u_{q\_AB\_k}$, $u_{q\_BC\_k}$ and $u_{q\_CA\_k}$ can be further determined based on the phase voltages $u_{q\_A\_k}$, $u_{q\_B\_k}$, and $u_{q\_C\_k}$ based on equation (9). For example, the voltage $u_{q\_AB\_k}$, i.e. the voltage between phase A and B, can be determined by:

$$u_{q\_AB\_k} = u_{q\_A\_k} - u_{q\_B\_k} \quad (10)$$

$$= u_{AB\_k} - \left[R \cdot i_{AB\_k} + (L_s - L_m) \cdot \dfrac{di_{AB\_k}}{dt}\right]$$

$$= u_{AB\_k} - \left[R \cdot i_{AB\_k} + L \cdot \dfrac{di_{AB\_k}}{dt}\right]$$

wherein $u_{AB\_k}$ and $i_{AB\_k}$ respectively represent the voltage and current between phase A and phase B at the measurement point; R and L mean a positive sequence resistance and inductance for the phase line, L equals to the difference of $L_s$ and $L_m$, i.e., $L = L_s - L_m$.

According to the differential equation (10), the phase-to-phase voltages $u_{q\_AB\_k}$, $u_{q\_BC\_k}$, and $u_{q\_CA\_k}$ can be determined by the differential equations such as:

$$\begin{cases} u_{q\_AB\_k} = u_{AB\_k} - \left(R \cdot i_{AB\_k} + L \cdot \dfrac{di_{AB\_k}}{dt}\right) \\ u_{q\_BC\_k} = u_{BC\_k} - \left(R \cdot i_{BC\_k} + L \cdot \dfrac{di_{BC\_k}}{dt}\right) \\ u_{q\_CA\_k} = u_{CA\_k} - \left(R \cdot i_{CA\_k} + L \cdot \dfrac{di_{CA\_k}}{dt}\right) \end{cases} \quad (11)$$

wherein $u_{AB\_k}$, $i_{AB\_k}$ respectively represents the voltage and current between phase A and phase B at the measurement point; $u_{BC\_k}$, $i_{BC\_k}$ respectively represent the voltage and current between phase B and phase C at the measurement point; $u_{CA\_k}$, $i_{CA\_k}$ respectively represent the voltage and current between phase C and phase A at the measurement point; R and L mean the positive sequence resistance and inductance for the phase line, L equals to the difference of $L_s$ and $L_m$, i.e., $L = L_s - L_m$.

Thus, the phase voltages $u_{A\_k}$, $u_{B\_k}$ and $u_{C\_k}$ can be determined based on the following equations.

$$\begin{cases} u_{q\_A\_k} = u_{A\_k} - (R \cdot i_{A\_k} + k_R \cdot 3i_{0\_k}) + L \cdot \dfrac{d(i_{A\_k} + k_L \cdot 3i_{0\_k})}{dt} \\ u_{q\_B\_k} = u_{B\_k} - (R \cdot i_{B\_k} + k_R \cdot 3i_{0\_k}) + L \cdot \dfrac{d(i_{B\_k} + k_L \cdot 3i_{0\_k})}{dt} \\ u_{q\_C\_k} = u_{A\_k} - (R \cdot i_{C\_k} + k_R \cdot 3i_{0\_k}) + L \cdot \dfrac{d(i_{C\_k} + k_L \cdot 3i_{0\_k})}{dt} \\ k_R = \dfrac{R_0 - R_1}{3R_1} \\ k_L = \dfrac{L_0 - L_1}{3L_1} \end{cases} \quad (12)$$

wherein $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k; $K_R$ represents a factor determined based on $R_0$, $R_1$ as indicated in equation (12); $K_L$ represents a factor determined based on $L_0$, $L_1$ as indicated in equation (12).

In one embodiment:
the instantaneous comparison voltage value is calculated by:

$$\begin{cases} u_{res\_p1p2\_k} = R \cdot i_{p1p2\_k} + L \cdot \dfrac{di_{p1p2\_k}}{dt} \\ u_{res\_p1\_k} = R \cdot (i_{p1\_k} + k_R \cdot 3i_{0\_k}) + L \cdot \dfrac{d(i_{p1\_k} + k_L \cdot 3i_{0\_k})}{dt} \\ k_R = \dfrac{R_0 - R_1}{3R_1} \\ k_L = \dfrac{L_0 - L_1}{3L_1} \end{cases}$$

wherein p1 and p2 respectively represents different phases of the three-phase transmission line, $u_{res\_p1p2\_k}$ represents the instantaneous comparison voltage value between phase p1 and phase p2 at instant k, $i_{p1p2\_k}$ represents the sampled current between phase p1 and phase p2 at the measurement point at instant k, $i_{p1\_k}$ represents the sampled current of phase p1 at the measurement point at instant k, R represents a resistance value of a resistor in the lumped parameter model, L represents an inductance value of an inductor in the lumped parameter model, $$\dfrac{di_{p1p2\_k}}{dt}$$

represents the differential value of the current $i_{p1p2\_k}$, $$\dfrac{d(i_{p1\_k} + k_L \cdot 3i_{0\_k})}{dt}$$

represents the differential value of the value $i_{p1\_k} + k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

Since p1 and p2 can be one of the phases A, B, and C. There are six-loop voltages needed to be calculated, includes: $u_{res\_AB\_k}$, $u_{res\_BC\_k}$, $u_{res\_CA\_k}$, $u_{res\_A\_k}$, $u_{res\_B\_k}$, and $u_{res\_C\_k}$. With the same derivation process as that of deriving the instantaneous measurement point voltage value in 3-phases system, the instantaneous comparison voltage value in 3-phases system is:

$$\begin{cases} u_{res\_AB\_k} = R \cdot i_{AB\_k} + L \cdot \frac{di_{AB\_k}}{dt} \\ u_{res\_BC\_k} = R \cdot i_{BC\_k} + L \cdot \frac{di_{BC\_k}}{dt} \\ u_{res\_CA\_k} = R \cdot i_{CA\_k} + L \cdot \frac{di_{CA\_k}}{dt} \end{cases} \quad (13)$$

wherein $i_{AB\_k}$ represents the current between phase A and phase B at the measurement point; $i_{BC\_k}$ represents the current between phase B and phase C at the measurement point; $i_{CA\_k}$ represents the current between phase C and phase A at the measurement point; R and L mean the positive sequence resistance and inductance for the phase line, L equals to the difference of $L_s$ and $L_m$, i.e., $L=L_s-L_m$; $L_s$ represents the phase inductance for phase A, phase B and phase C; and $L_m$ represents the inductance between phases for phase A, phase B and phase C.

$$\begin{cases} u_{res\_A\_k} = R \cdot (i_{A\_k} + k_R \cdot 3i_{0\_k}) + L \cdot \frac{d(i_{A\_k} + k_L \cdot 3i_{0\_k})}{dt} \\ u_{res\_B\_k} = R \cdot (i_{B\_k} + k_R \cdot 3i_{0\_k}) + L \cdot \frac{d(i_{B\_k} + k_L \cdot 3i_{0\_k})}{dt} \\ u_{res\_C\_k} = R \cdot (i_{C\_k} + k_R \cdot 3i_{0\_k}) + L \cdot \frac{d(i_{C\_k} + k_L \cdot 3i_{0\_k})}{dt} \\ k_R = \frac{R_0 - R_1}{3R_1} \\ k_L = \frac{L_0 - L_1}{3L_1} \end{cases} \quad (14)$$

wherein $i_{A\_k}$, $i_{B\_k}$ and $i_{C\_k}$ respectively represents currents for phase A, phase B and phase C at the measurement point, at instant k; $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$, represents zero sequence current at instant k; $K_R$ represents a factor determined based on $R_0$, $R_1$ as indicated in equation (14); $K_L$ represents a factor determined based on $L_0$, $L_1$ as indicated in equation (14).

In one embodiment:
the lumped parameter model comprises any of a Resistor-Inductor-Capacitor (RLC) model or a Resistor-Inductor (RL) model.

Figure 4:
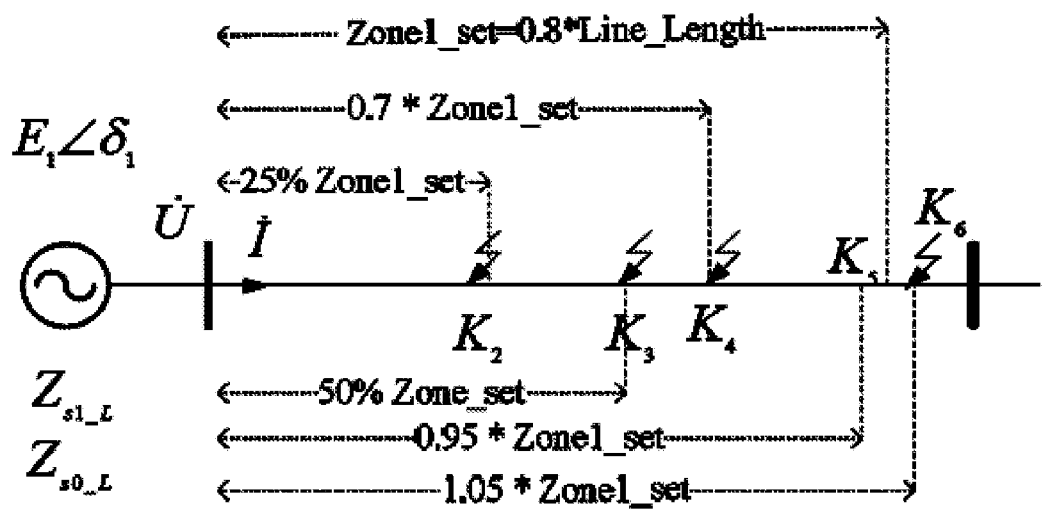
FIG. 4 shows a simulation model of the present invention.

FIG. 4 shows a simulation model. The voltage level of the simulation model is 245 kV, the length of the line is 100 km. The system impedance of power source is: $Z_{s1\_L}=16.9e^{j89°}$, $Z_{s0\_L}=47.2e^{j80°}$ (SIR=0.5). The sampling rate is 1 kHz.

In the simulation, the protection scope is set to be 80% of the line length:

$$L_{set}=0.80 \cdot \text{Length} \quad (15)$$

$k_2$ is at the location of 25% zone 1 setting, $k_3$ is at the location of 50% zone 1 setting, $k_4$ is at the point of 70% setting scope, $k_5$ is at 95% zone 1 setting, $k_6$ is beyond the protection scope to simulation external fault (1.05*Setting).

Figure 5:
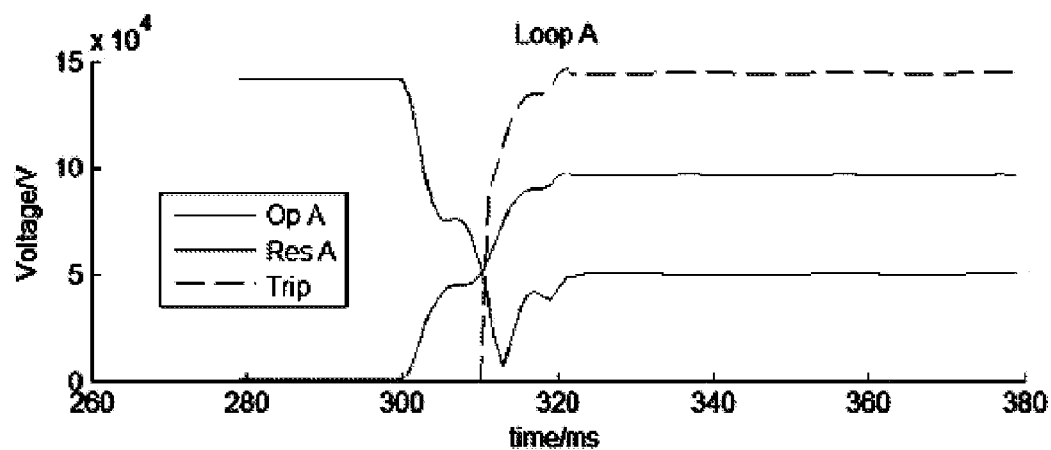
FIG. 5 shows an internal fault occurs at K2, method of the present invention operates in 11 ms.

FIG. 5 shows an internal fault occurs at K2, method of the present invention operates in 11 ms.

Figure 6:
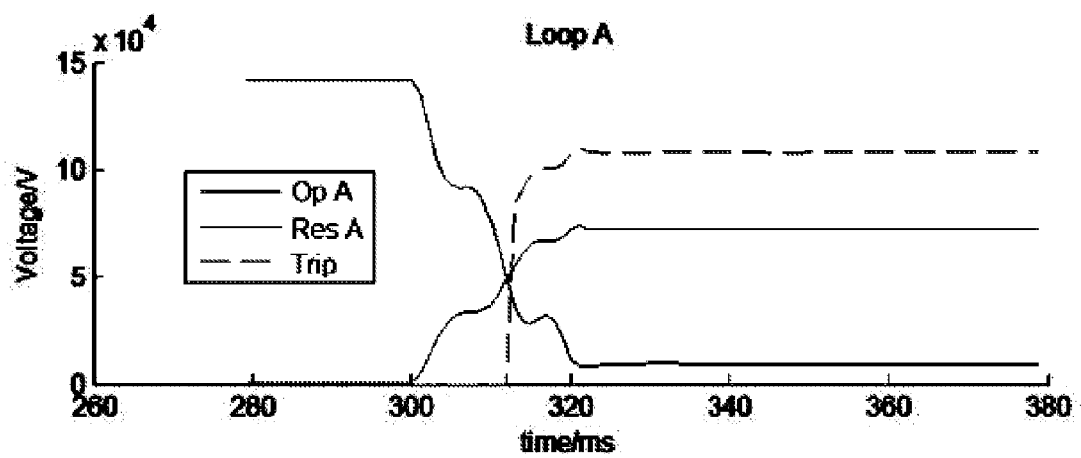
FIG. 6 shows an internal fault occurs at K3, method of the present invention operates in 13 ms.

FIG. 6 shows an internal fault occurs at K3, method of the present invention operates in 13 ms.

Figure 7:
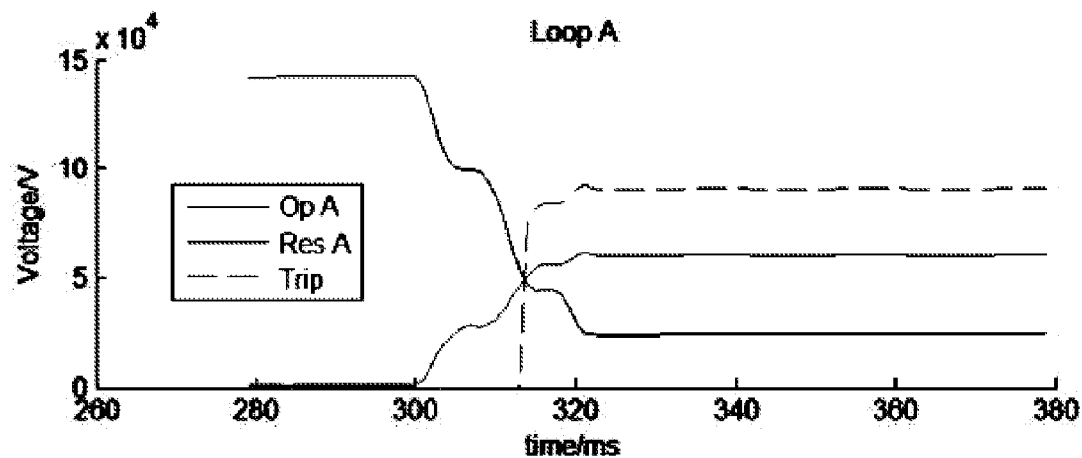
FIG. 7 shows an internal fault occurs at K4, method of the present invention operates in 14 ms.

FIG. 7 shows an internal fault occurs at K4, method of the present invention operates in 14 ms.

Figure 8:
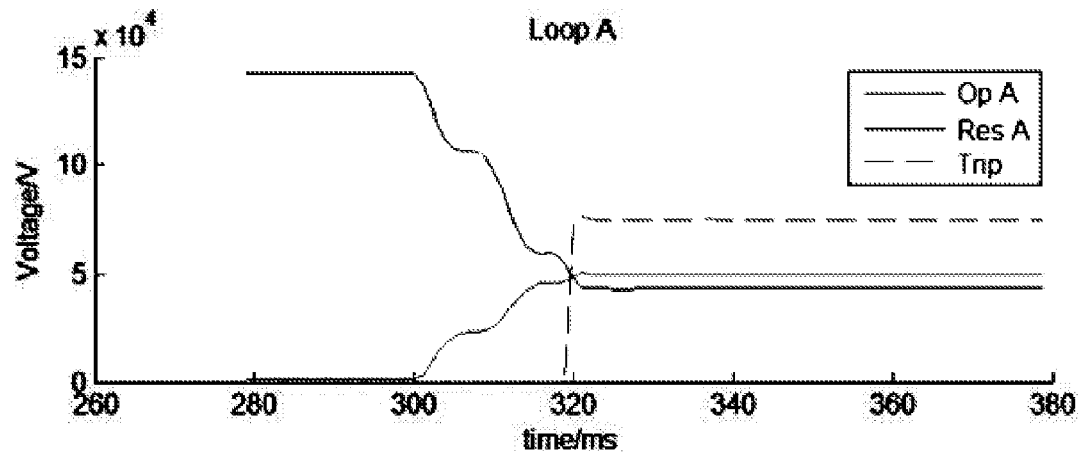
FIG. 8 shows an internal fault occurs at K5, method of the present invention operates in 20 ms.

FIG. 8 shows an internal fault occurs at K5, method of the present invention operates in 20 ms.

Figure 9:
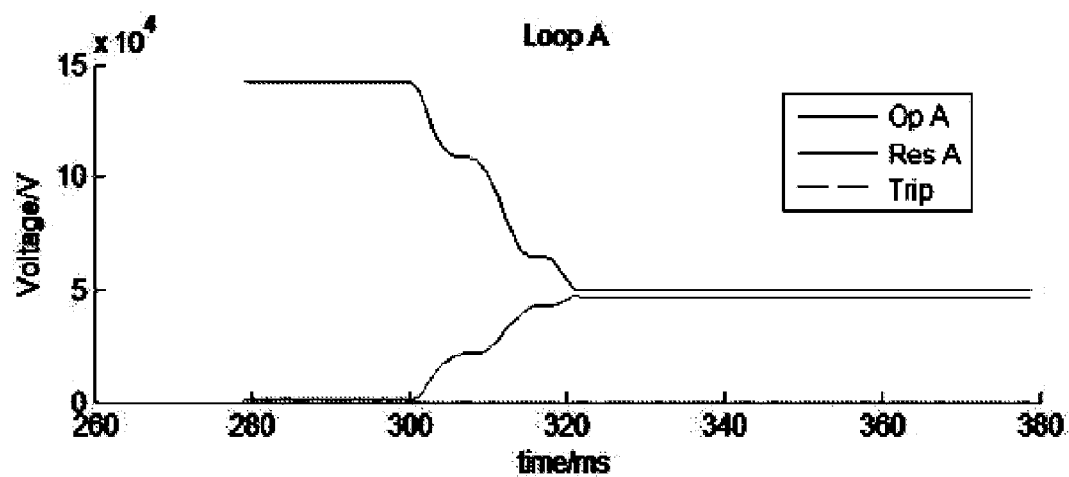
FIG. 9 shows an external fault at K6, method of the present invention does not operate.

FIG. 9 shows an external fault at K6, method of the present invention does not operate.

Figure 10:
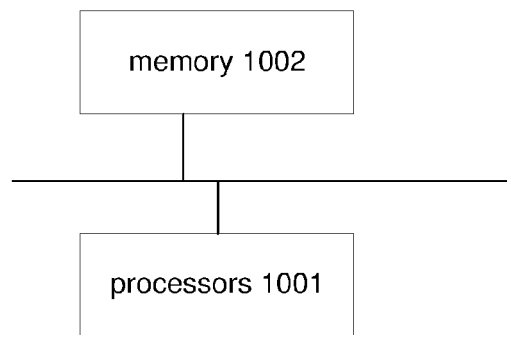
FIG. 10 shows a structural module drawing of a system for fault detection in line protection for power transmission system.

FIG. 10 Shows a structural module drawing of a system for fault detection in line protection for power transmission system, comprising:
one or more processors 1001;
a memory 1002 coupled to at least one of the processors; and
a set of program instructions stored in the memory and executable by at least one of the processors 1001 to cause the system to:
obtaining a sampled value of voltage at a measurement point, at which a protection device for the line protection is installed, on an electrical line;
obtaining a sampled value of current at a measurement point;
calculating an instantaneous measurement point voltage value specified by operation criterion of a protection device from the sampled value of voltage at the measurement point, and the sampled value of current at the measurement point by using measurement differential equation according to a time domain lumped parameter model for the electrical line;
calculating an instantaneous comparison voltage value specified by operation criterion of a protection device from the sampled value of voltage at the measurement point, and the sampled value of current at the measurement point by using comparison differential equation according to a time domain lumped parameter model for the electrical line; and performing the fault detection based on the comparison result of the instantaneous measurement point voltage value and the instantaneous comparison voltage value.

In one embodiment:
the instantaneous measurement point voltage value is calculated by:

$$u_{q\_k} = m_1 \cdot u_k + m_2 \cdot \left(R \cdot i_k + L \cdot \frac{di_k}{dt}\right)$$

wherein $u_{q\_k}$ represents the instantaneous measurement point voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $\frac{di_k}{dt}$ represents the differential value of the current $i_k$, $m_1$ and $m_2$ are coefficients specified by operation criterion of a protection device.

In one embodiment:
the instantaneous comparison voltage value is calculated by:

$$u_{res\_k} = m_3 \cdot u_k + m_4 \cdot \left( R \cdot i_k + L \cdot \frac{di_k}{dt} \right)$$

wherein $u_{res\_k}$ represents the instantaneous comparison voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $\frac{di_k}{dt}$ represents the differential value of the sampled value of current $i_k$ at instant k, $m_3$ and $m_4$ are coefficients specified by operation criterion of a protection device.

In one embodiment:
the instantaneous measurement point voltage value is calculated by:

$$\begin{cases} u_{q\_p1p2\_k} = u_{p1p2\_k} - \left( R \cdot i_{p1p2\_k} + L \cdot \frac{di_{p1p2\_k}}{dt} \right) \\ u_{q\_p1p2\_k} = u_{p1\_k} - \left[ R \cdot (i_{p1\_k} + k_R \cdot 3i_{0\_k}) + L \cdot \frac{d(i_{p1\_k} + k_L \cdot 3i_{0\_k})}{dt} \right] \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$ respectively represents the sampled voltage and sampled current between phase p1 and phase p2 at the measurement point at instant k, $u_{p1\_k}$, $i_{p1\_k}$ respectively represents the sampled voltage and sampled current of phase p1 at the measurement point at instant k, R represents a resistance value of a resistor in the lumped parameter model, L represents an inductance value of an inductor in the lumped parameter model, $\frac{di_{p1p2\_k}}{dt}$ represents the differential value of the current $i_{p1p2\_k}$, $\frac{d(i_{p1\_k} + k_L \cdot 3i_{0\_k})}{dt}$ represents the differential value of the value $i_{p1\_k} + k_L \cdot 3i_{0\_k}$, R0 represents zero sequence resistance of the three-phase transmission line; R1 represents positive sequence resistance of the three-phase transmission line; L0 represents zero sequence inductance of the three-phase transmission line; L1 represents positive sequence inductance of the three-phase transmission line; $i_{0\_k}$ represents zero sequence current at instant k.

In one embodiment:
the instantaneous comparison voltage value is calculating by:

$$\begin{cases} u_{res\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{res\_p1p2\_k}$ represents the instantaneous comparison voltage value between phase p1 and phase p2 at instant k, $i_{p1p2\_k}$ represents the sampled current between phase p1 and phase p at the measurement point at instant k, $i_{p1\_k}$ represents the sampled current of phase p1 at the measurement point at instant k, R represents a resistance value of a resistor in the lumped parameter model, L represents an inductance value of an inductor in the lumped parameter model, $\frac{di_{p1p2\_k}}{dt}$ represents the differential value of the current $i_{p1p2\_k}$, $\frac{d(i_{p1\_k} + k_L \cdot 3i_{0\_k})}{dt}$ represents the differential value of the value $i_{p1\_k} + k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

In one embodiment:
the lumped parameter model comprises any of a Resistor-Inductor-Capacitor (RLC) model or a Resistor-Inductor (RL) model.

Figure 11:
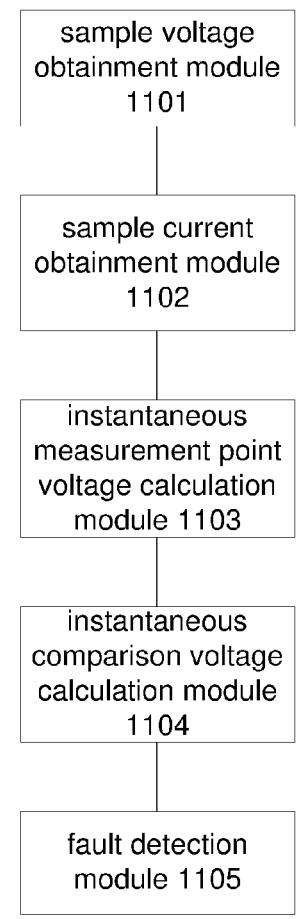
FIG. 11 shows a structural module drawing of an apparatus for fault detection in line protection for a power transmission system.
Figure 12:
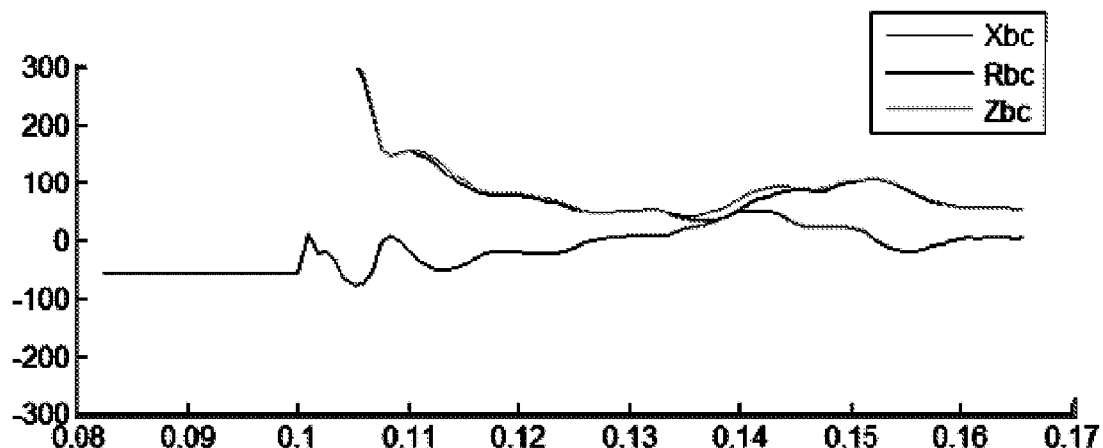
FIG. 12 shows the simulation of prior art when an external fault occurs in the parallel line, both lines is with series compensated line.

FIG. 11 shows a structural module drawing of an apparatus for fault detection in line protection for a power transmission system, comprising:

a sample voltage obtainment module 1101, configured to obtain a sampled value of voltage at a measurement point, at which a protection device for the line protection is installed, on an electrical line;

a sample current obtainment module 1102, configured to obtain a sampled value of current at a measurement point;

an instantaneous measurement point voltage calculation module 1103, configured to calculate an instantaneous measurement point voltage value specified by operation criterion of a protection device from the sampled value of voltage at the measurement point, and the sampled value of current at the measurement point by using measurement differential equation according to a time domain lumped parameter model for the electrical line;

an instantaneous comparison voltage calculation module 1104, configured to calculate an instantaneous comparison voltage value specified by operation criterion of a protection device from the sampled value of voltage at the measurement point, and the sampled value of current at the measurement point by using comparison differential equation according to a time domain lumped parameter model for the electrical line; and a fault detection module 1105, configured to perform the fault detection based on the comparison result of the instantaneous measurement point voltage value and the instantaneous comparison voltage value.

In one embodiment:
the measurement differential equation transfers from $|m_1 \cdot \dot{U} + m_2 \cdot Z_1 \cdot \dot{I}|$, and the comparison differential equation transfers from $|m_3 \cdot \dot{U} + m_4 \cdot Z_2 \cdot \dot{I}|$, wherein $m_1$, $m_2$, $m_3$, and $m_4$ are coefficients specified by operation criterion of a protection device, $Z_1$ and $Z_2$ are impedances specified by operation criterion of a protection device, $\dot{U}$ is voltage vector at the measurement point and $\dot{I}$ is current vector at the measurement point.

In one embodiment:
the instantaneous measurement point voltage value is calculated by:

$$u_{q\_k} = m_1 \cdot u_k + m_2 \cdot \left(R \cdot i_k + L \cdot \frac{di_k}{dt}\right)$$

wherein $u_{q\_k}$ represents the instantaneous measurement point voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the ditterential value of the current $i_k$, $m_1$ and $m_2$ are coefficients specified by operation criterion of a protection device.

In one embodiment:
the instantaneous comparison voltage value is calculated by:

$$u_{res\_k} = m_3 \cdot u_k + m_4 \cdot \left(R \cdot i_k + L \cdot \frac{di_k}{dt}\right)$$

wherein $u_{res\_k}$ represents the instantaneous comparison voltage value at instant k, $u_k$ represents the sampled value of voltage at a measurement point at instant k, $i_k$ represents the sampled value of current at the measurement point at instant k, R represents a resistance value of a resistor in the lumped parameter model, L represents an inductance value of an inductor in the lumped parameter model, and $$\frac{di_k}{dt}$$

represents the ditterential value of the sampled value of current $i_k$ at instant k, $m_3$ and $m_4$ are coefficients specified by operation criterion of a protection device.

In one embodiment:
the instantaneous measurement point voltage value is calculated by:

$$\begin{cases} u_{q\_p1p2\_k} = u_{p1p2\_k} - \left(R \cdot i_{p1p2\_k} + L \cdot \frac{di_{p1p2\_k}}{dt}\right) \\ u_{q\_p1\_k} = u_{p1\_k} - \left[R \cdot (i_{p1\_k} + k_R \cdot 3i_{0\_k}) + L \cdot \frac{d(i_{p1\_k} + k_L \cdot 3i_{0\_k})}{dt}\right] \\ k_R = \frac{R_0 - R_1}{3R_1} \\ k_L = \frac{L_0 - L_1}{3L_1} \end{cases}$$

wherein p1 and p2 respectively represents different phase of the three-phase transmission line, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$ respectively represents the sampled voltage and sampled current between phase p1 and phase p2 at the measurement point at instant k, $u_{p1\_k}$, $i_{p1\_k}$ respectively represents the sampled voltage and sampled current of phase p1 at the measurement point at instant k, R represents a resistance value of a resistor in the lumped parameter model, L represents an inductance value of an inductor in the lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k} + k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

In one embodiment:
the instantaneous comparison voltage value is calculated by:

$$\begin{cases} u_{res\_p1p2\_k} = R \cdot i_{p1p2\_k} + L \cdot \dfrac{di_{p1p2\_k}}{dt} \\ u_{res\_p1\_k} = R \cdot (i_{p1\_k} + k_R \cdot 3i_{0\_k}) + L \cdot \dfrac{d(i_{p1\_k} + k_L \cdot 3i_{0\_k})}{dt} \\ k_R = \dfrac{R_0 - R_1}{3R_1} \\ k_L = \dfrac{L_0 - L_1}{3L_1} \end{cases}$$

wherein p1 and p2 respectively represents different phase of the three-phase transmission line, $u_{res\_p1p2\_k}$ represents the instantaneous comparison voltage value between phase p1 and phase p2 at instant k, $i_{p1p2\_k}$ represents the sampled current between phase p1 and phase p2 at the measurement point at instant k, $i_{p1\_k}$ represents the sampled current of phase p1 at the measurement point at instant k, R represents a resistance value of a resistor in the lumped parameter model, L represents an inductance value of an inductor in the lumped parameter model, $$\dfrac{di_{p1p2\_k}}{dt}$$

represents the differential value of the current $i_{p1p2\_k}$, $$\dfrac{d(i_{p1\_k} + k_L \cdot 3i_{0\_k})}{dt}$$

represents the differential value of the value $i_{p1\_k} + k_L \cdot 3i_{0\_k}$, $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k.

In one embodiment:
the lumped parameter model comprises any of a Resistor-Inductor-Capacitor (RLC) model or a Resistor-Inductor (RL) model.

The above-identified embodiments are only used for representing several examples of the present invention, which are illustrated in detail, but shall not be understood to limit the protection scope of the present patent. It should be noted that, several modifications and/or improvements may be made for the skilled in the art, without going beyond the technical concept of the present invention, all of which fall into the protection scope of the present invention. Therefore, the protection scope of the present invention is dependent on the accompanied Claims.

The invention claimed is:

1. A method for a fault detection in line protection for a power transmission system, comprising:

obtaining a sampled value of a voltage at a measurement point on an electrical line, wherein the measurement point corresponds to a location at which a protection device for the line protection is installed;

obtaining a sampled value of a current at the measurement point;

calculating an instantaneous measurement point voltage value specified by an operation criterion of the protection device, wherein the instantaneous measurement point voltage value is calculated by:

$$\begin{cases} u_{q\_p1p2\_k} = u_{p1p2\_k} - \left(R \cdot i_{p1p2\_k} + L \cdot \dfrac{di_{p1p2\_k}}{dt}\right) \\ u_{q\_p1\_k} = u_{p1\_k} - \left[R \cdot (i_{p1\_k} + k_R \cdot 3i_{0\_k}) + L \cdot \dfrac{d(i_{p1\_k} + k_L \cdot 3i_{0\_k})}{dt}\right] \\ k_R = \dfrac{R_0 - R_1}{3R_1} \\ k_L = \dfrac{L_0 - L_1}{3L_1} \end{cases}$$

wherein p1 and p2 represent first and second phases, respectively, of a three-phase transmission line of the power transmission system, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$ respectively, represent the sampled value of the voltage and the sampled value of the current between phase p1 and phase p2 at the measurement point at instant k, $u_{p1\_k}$, $i_{p1\_k}$, respectively, represent the sampled value of the voltage and the sampled value of the current of phase p1 at the measurement point at instant k, R and L, respectively, represent a resistance value of a resistor and an inductance value of an inductor in a time-domain lumped parameter model, $$\dfrac{di_{p1p2\_k}}{dt}$$

represents a differential value of the current $i_{p1p2\_k}$, $$\dfrac{d(i_{p1\_k} + k_L \cdot 3i_{0\_k})}{dt}$$

represents a differential value of the value $i_{p1\_k} + k_L \cdot 3i_{0\_k}$, $R_0$ represents a zero sequence resistance of the three-phase transmission line, $R_1$ represents a positive sequence resistance of the three-phase transmission line, $L_0$ represents a zero sequence inductance of the three-phase transmission line, $L_1$ represents a positive sequence inductance of the three-phase transmission line, and $i_{0\_k}$ represents a zero sequence current at instant k;

calculating an instantaneous comparison voltage value specified by the operation criterion of the protection device, wherein the calculating the instantaneous comparison voltage value is based on the sampled value of the voltage and the sampled value of the current in accordance with a comparison differential equation corresponding to the time-domain lumped parameter model;

comparing the instantaneous measurement point voltage value specified by the operation criterion of the protection device and the instantaneous comparison voltage value; and tripping the electrical line based on a result of the comparison of the instantaneous measurement point voltage value specified by the operation criterion of the protection device and the instantaneous comparison voltage value indicating a fault on the electrical line.

2. The method according to claim 1, wherein the instantaneous comparison voltage value is calculated by:

$$u_{res\_k} = m_3 \cdot u_k + m_4 \cdot \left( R \cdot i_k + L \cdot \frac{di_k}{dt} \right)$$

wherein $u_{res\_k}$ represents the instantaneous comparison voltage value at instant k, $u_k$ represents the sampled value of the voltage at instant k, $i_k$ represents the sampled value of the current at instant k, R and L, respectively, represent the resistance value of the resistor and the inductance value of the inductor in the time-domain lumped parameter model, $$\frac{di_k}{dt}$$

represents a differential value of the sampled value of current $i_k$, and $m_3$ and $m_4$ are coefficients specified by the operation criterion of the protection device.

3. The method according to claim 1, wherein the instantaneous comparison voltage value is calculated by:

$$\begin{cases} u_{q\_p1p2\_k} = u_{p1p2\_k} - \left( R \cdot i_{p1p2\_k} + L \cdot \frac{di_{p1p2\_k}}{dt} \right) \\ u_{q\_p1\_k} = u_{p1\_k} - \left[ R \cdot (i_{p1\_k} + k_R \cdot 3i_{0\_k}) + L \cdot \frac{d(i_{p1\_k} + k_L \cdot 3i_{0\_k})}{dt} \right] \\ k_R = \frac{R_0 - R_1}{3R_1} \\ k_L = \frac{L_0 - L_1}{3L_1} \end{cases}$$

wherein p1 and p2 represent the first and second phases, respectively, of the three-phase transmission line of the power transmission system, $u_{res\_p1p2\_k}$ represents the instantaneous comparison voltage value between phase p1 and phase p2 at instant k, $i_{p1p2\_k}$ represents the sampled value of the current between phase p1 and phase p2 at the measurement point at instant k, $i_{p1\_k}$ represents the sampled value of the current of phase p1 at the measurement point at instant k, R and L, respectively, represent the resistance value of the resistor and the inductance value of the inductor in the time-domain lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k} + k_L \cdot 3i_{0\_k}$, $R_0$ represents the zero sequence resistance of the three-phase transmission line, $R_1$ represents the positive sequence resistance of the three-phase transmission line, $L_0$ represents the zero sequence inductance of the three-phase transmission line, $L_1$ represents the positive sequence inductance of the three-phase transmission line, and $i_{0\_k}$ represents the zero sequence current at instant k.

4. The method according to claim 1, wherein the time-domain lumped parameter model comprises any of a Resistor-Inductor-Capacitor (RLC) model or a Resistor-Inductor (RL) model.

5. The method according to claim 1, wherein the instantaneous comparison voltage value specified by the operation criterion of the protection device is calculated by:

determining the instantaneous comparison voltage value between the first phase and the second phase of the three-phase transmission line of the power transmission system, based on:

the sampled value of the current between the first and second phases at the measurement point;

the resistance value of the resistor and the inductance value of the inductor in the time-domain lumped parameter model; and a differential value of the sampled value of the current between the first and second phases at the measurement point; and determining the instantaneous comparison voltage value of the first phase based on:

the sampled value of the current of the first phase at the measurement point;

the resistance value of the resistor and the inductance value of the inductor in the time-domain lumped parameter model;

a proportion of the zero and positive sequence resistances of the three-phase transmission line;

the zero sequence current; and a differential value of a combination of the sampled value of the current of the first phase at the measurement point, a proportion of zero and positive sequence inductances of the three-phase transmission line, and the zero sequence current.

6. A system for a fault detection in line protection for power transmission system, comprising:

one or more processors;

a non-transitory memory storage coupled to at least one of the processors; and a set of program instructions stored in the non-transitory memory storage and executable by at least one of the processors to cause the system to:

obtain a sampled value of a voltage at a measurement point on an electrical line, wherein the measurement point corresponds to a location at which a protection device for the line protection is installed;
obtain a sampled value of a current at the measurement point;
calculate an instantaneous measurement point voltage value specified by an operation criterion of the protection device, wherein calculating the instantaneous measurement point voltage value is calculated by:

$$\begin{cases} u_{res\_p1p2\_k} = R \cdot i_{p1p2\_k} + L \cdot \dfrac{di_{p1p2\_k}}{dt} \\ u_{res\_p1\_k} = R \cdot (i_{p1\_k} + k_R \cdot 3i_{0\_k}) + L \cdot \dfrac{d(i_{p1\_k} + k_L \cdot 3i_{0\_k})}{dt} \\ k_R = \dfrac{R_0 - R_1}{3R_1} \\ k_L = \dfrac{L_0 - L_1}{3L_1} \end{cases}$$

wherein p1 and p2 represent first and second phases, respectively, of a three-phase transmission line of the power transmission system, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$, respectively, represent the sampled value of the voltage and the sampled value of the current between phase p1 and phase p2 at the measurement point at instant k, $u_{p1\_k}$, $i_{p1\_k}$, respectively, represent the sampled value of the voltage and sampled value of the current of phase p1 at the measurement point at instant k, R and L, respectively, represent a resistance value of a resistor and an inductance value of an inductor in a time-domain lumped parameter model, $$\dfrac{di_{p1p2\_k}}{dt}$$

represents a differential value of the current $i_{p1p2\_k}$, $$\dfrac{d(i_{p1\_k} + k_L \cdot 3i_{0\_k})}{dt}$$

represents a differential value of the value $i_{p1\_k} + k_L \cdot 3i_{0\_k}$, $R_0$ represents a zero sequence resistance of the three-phase transmission line, $R_1$ represents a positive sequence resistance of the three-phase transmission line, $L_0$ represents a zero sequence inductance of the three-phase transmission line, $L_1$ represents a positive sequence inductance of the three-phase transmission line, and $i_{0\_k}$ represents a zero sequence current at instant k;

calculate an instantaneous comparison voltage value specified by the operation criterion of the protection device, wherein calculating the instantaneous comparison voltage value is based on the sampled value of the voltage and the sampled value of current in accordance with a comparison differential equation corresponding to the time-domain lumped parameter model;

compare the instantaneous measurement point voltage value specified by the operation criterion of the protection device and the instantaneous comparison voltage value; and trip the electrical line based on a result of the comparison of the instantaneous measurement point voltage value specified by the operation criterion of the protection device and the instantaneous comparison voltage value indicating a fault on the electrical line.

7. The system according to claim 6, wherein the instantaneous comparison voltage value is calculated by:

$$u_{q\_k} = m_1 \cdot u_k + m_2 \cdot \left( R \cdot i_k + L \cdot \dfrac{di_k}{dt} \right)$$

wherein $u_{res\_k}$ represents the instantaneous comparison voltage value at instant k, $u_k$ represents the sampled value of the voltage at instant k, $i_k$ represents the sampled value of the current at instant k, R and L, respectively, represent the resistance value of the resistor and the inductance value of the inductor in the time-domain lumped parameter model, $$\dfrac{di_k}{dt}$$

represents a differential value of the sampled value of current $i_k$ at instant k, and $m_3$ and $m_4$ are coefficients specified by the operation criterion of the protection device.

8. The system according to claim 6, wherein the instantaneous comparison voltage value is calculated by:

$$\begin{cases} u_{res\_p1p2\_k} = R \cdot i_{p1p2\_k} + L \cdot \dfrac{di_{p1p2\_k}}{dt} \\ u_{res\_p1\_k} = R \cdot (i_{p1\_k} + k_R \cdot 3i_{0\_k}) + L \cdot \dfrac{d(i_{p1\_k} + k_L \cdot 3i_{0\_k})}{dt} \\ k_R = \dfrac{R_0 - R_1}{3R_1} \\ k_L = \dfrac{L_0 - L_1}{3L_1} \end{cases}$$

wherein p1 and p2 represent the first and second phases of the three-phase transmission line of the power transmission system, $u_{res\_p1p2\_k}$ represents the instantaneous comparison voltage value between phase p1 and phase p2 at instant k, $i_{p1p2\_k}$ represents the sampled value of the current between phase p1 and phase p2 at the measurement point at instant k, $i_{p1\_k}$ represents the sampled value of the current of phase p1 at the measurement point at instant k, R and L, respectively, represent the resistance value of the resistor and the inductance value of the inductor in the time-domain lumped parameter model, $$\dfrac{di_{p1p2\_k}}{dt}$$

represents the differential value of the current $i_{p1p2\_k}$, $$\dfrac{d(i_{p1\_k} + k_L \cdot 3i_{0\_k})}{dt}$$

represents the differential value of the value $i_{p1\_k}+k_L \cdot 3i_{0\_k}$, $R_0$ represents the zero sequence resistance of the three-phase transmission line, $R_1$ represents the positive sequence resistance of the three-phase transmission line, $L_0$ represents the zero sequence inductance of the three-phase transmission line, $L_1$ represents the positive sequence inductance of the three-phase transmission line, and $i_{0\_k}$ represents the zero sequence current at instant k.

9. The system according to claim 6, wherein the time-domain lumped parameter model comprises any of a Resistor-Inductor-Capacitor (RLC) model or a Resistor-Inductor (RL) model.

10. The system of claim 9, wherein calculating the instantaneous comparison voltage value specified by the operation criterion of the protection device is based on:

determining the instantaneous comparison voltage value between the first phase and the second phase of the three-phase transmission line of the power transmission system, based on:
  the sampled value of the current between the first and second phases at the measurement point;
  the resistance value of the resistor and the inductance value of the inductor in the time-domain lumped parameter model; and
  a differential value of the sampled value of the current between the first and second phases at the measurement point; and determining the instantaneous comparison voltage value of the first phase based on:
  the sampled value of the current of the first phase at the measurement point;
  the resistance value of the resistor and the inductance value of the inductor in the time-domain lumped parameter model;
  a proportion of the zero and positive sequence resistances of the three-phase transmission line;
  the zero sequence current; and
  a differential value of a combination of the sampled value of the current of the first phase at the measurement point, a proportion of zero and positive sequence inductances of the three-phase transmission line, and the zero sequence current.

11. A method for a fault detection in line protection for a power transmission system, comprising:

obtaining a sampled value of a voltage at a measurement point on an electrical line, wherein the measurement point corresponds to a location at which a protection device for the line protection is installed;

obtaining a sampled value of a current at the measurement point;

calculating an instantaneous measurement point voltage value specified by an operation criterion of the protection device, wherein calculating the instantaneous measurement point voltage value is based on the sampled value of the voltage and the sampled value of the current in accordance with a measurement differential equation corresponding to a time-domain lumped parameter model for the electrical line;

calculating an instantaneous comparison voltage value specified by the operation criterion of the protection device, wherein the instantaneous comparison voltage value is calculated by:

$$\begin{cases} u_{q\_p1p2\_k} = u_{p1p2\_k} - \left( R \cdot i_{p1p2\_k} + L \cdot \dfrac{di_{p1p2\_k}}{dt} \right) \\ u_{q\_p1\_k} = u_{p1\_k} - \left[ R \cdot (i_{p1\_k} + k_R \cdot 3i_{0\_k}) + L \cdot \dfrac{d(i_{p1\_k} + k_L \cdot 3i_{0\_k})}{dt} \right] \\ k_R = \dfrac{R_0 - R_1}{3R_1} \\ k_L = \dfrac{L_0 - L_1}{3L_1} \end{cases}$$

wherein p1 and p2 represent first and second phases, respectively, of a three-phase transmission line of the power transmission system, $u_{res\_p1p2\_k}$ represents the instantaneous comparison voltage value between phase p1 and phase p2 at instant k, $i_{p1p2\_k}$ represents the sampled value of the current between phase p1 and phase p2 at the measurement point at instant k, $i_{p1\_k}$ represents the sampled value of the current of phase p1 at the measurement point at instant k, R and L, respectively, represent a resistance value of a resistor and an inductance value of an inductor in the time-domain lumped parameter model, $$\frac{di_{p1p2\_k}}{dt}$$

represents a differential value of the current $i_{p1p2\_k}$, $$\frac{d(i_{p1\_k} + k_L \cdot 3i_{0\_k})}{dt}$$

represents a differential value of the $i_{p1\_k}+k_L \cdot 3i_{0\_k}$, $R_0$ represents a zero sequence resistance of the three-phase transmission line, $R_1$ represents a positive sequence resistance of the three-phase transmission line, $L_0$ represents a zero sequence inductance of the three-phase transmission line, $L_1$ represents a positive sequence inductance of the three-phase transmission line, and $i_{0\_k}$ represents a zero sequence current at instant k;

comparing the instantaneous measurement point voltage value and the instantaneous comparison voltage value specified by the operation criterion of the protection device; and tripping the electrical line based on a result of the comparison of the instantaneous measurement point voltage value and the instantaneous comparison voltage value specified by the operation criterion of the protection device indicating a fault on the electrical line.

12. The method according to claim 11, wherein the instantaneous measurement point voltage value is calculated by:

$$u_{q\_k}=m_1 \cdot u_k - m_2 \cdot (R \cdot i_k = L \cdot di_k/dt)$$

wherein $u_{q\_k}$ represents the instantaneous measurement point voltage value at instant k, $u_k$ represents the sampled value of the voltage at instant k, $i_k$ represents the sampled value of the current at instant k, R and L, respectively, represent the resistance value of the resistor and the inductance value of the inductor in the time-domain lumped parameter model, $$\frac{di_k}{dt}$$

represents a differential value of the sampled value of the current $i_k$, and $m_1$ and $m_2$ are coefficients specified by the operation criterion of the protection device.

13. The method according to claim 11, wherein the instantaneous measurement point voltage value is calculated by:

$$\begin{cases} u_{res\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$

wherein p1 and p2 represent the first and second phases, respectively, of the three-phase transmission line of the power transmission system, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$, respectively, represent the sampled value of the voltage and the sampled value of the current between phase p1 and phase p2 at the measurement point at instant k, $u_{p1\_k}$, $i_{p1\_k}$, respectively, represent the sampled value of the voltage and the sampled value of the current of phase p1 at the measurement point at instant k, R and L, respectively, represent the resistance value of the resistor and the inductance value of the inductor in the time-domain lumped parameter model, $$\frac{di_{p1p2\_k}}{dt}$$

represents the differential value of the current $i_{p1p2\_k}$, $$\frac{d(i_{p1\_k} + k_L \cdot 3i_{0\_k})}{dt}$$

represents the differential value of the value $i_{p1\_k} + k_L \cdot 3i_{0\_k}$, $R_0$ represents the zero sequence resistance of the three-phase transmission line, $R_1$ represents the positive sequence resistance of the three-phase transmission line, $L_0$ represents the zero sequence inductance of the three-phase transmission line, $L_1$ represents the positive sequence inductance of the three-phase transmission line, and $i_{0\_k}$ represents the zero sequence current at instant k.

14. The method according to claim 11, wherein the time-domain lumped parameter model comprises any of a Resistor-Inductor-Capacitor (RLC) model or a Resistor-Inductor (RL) model.

15. The method according to claim 11, wherein calculating the instantaneous measurement point voltage value comprises:
  determining the instantaneous measurement point voltage value between the first phase and the second phase of the three-phase transmission line of the power transmission system, based on:
    the sampled value of the voltage between the first and second phases at the measurement point;
    the sampled value of the current between the first and second phases at the measurement point;
    the resistance value of the resistor and the inductance value of the inductor in the time-domain lumped parameter model; and
    a differential value of the sampled value of the current between the first and second phases at the measurement point; and
  determining the instantaneous measurement point voltage value of the first phase based on:
    the sampled value of the voltage of the first phase at the measurement point;
    the sampled value of the current of the first phase at the measurement point;
    the resistance value of the resistor and the inductance value of the inductor in the time-domain lumped parameter model;
    a proportion of zero and positive sequence resistances of the three-phase transmission line;
    a zero sequence current; and
    a differential value of a combination of the sampled value of the current of the first phase at the measurement point, a proportion of zero and positive sequence inductances of the three-phase transmission line, and the zero sequence current.

16. A system for a fault detection in line protection for power transmission system, comprising:
  one or more processors;
  a non-transitory memory storage coupled to at least one of the processors; and
  a set of program instructions stored in the non-transitory memory storage and executable by at least one of the processors to cause the system to:
    obtain a sampled value of a voltage at a measurement point on an electrical line, wherein the measurement point corresponds to a location at which a protection device for the line protection is installed;
    obtain a sampled value of a current at the measurement point;
    calculate an instantaneous measurement point voltage value specified by an operation criterion of the protection device, wherein calculating the instantaneous measurement point voltage value is based on the sampled value of the voltage and the sampled value of the current in accordance with a measurement differential equation corresponding to a time-domain lumped parameter model for the electrical line;
    calculate an instantaneous comparison voltage value specified by the operation criterion of the protection device, wherein the instantaneous comparison voltage value is calculated by:

$$\begin{cases} u_{res\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$

wherein p1 and p2 represent first and second phases of a three-phase transmission line of the power transmission system, $u_{res\_p1p2\_k}$ represents the instantaneous comparison voltage value between phase p1 and phase p2 at instant k, $i_{p1p2\_k}$ represents the sampled value of the current between phase p1 and phase p2 at the measurement point at instant k, $i_{p1\_k}$ represents the sampled value of the current of phase p1 at the measurement point at instant k, R and L, respectively, represent a resistance value of a resistor and an inductance value of an inductor in the time-domain lumped parameter model, $$\frac{di_{p1p2\_k}}{dt}$$

represents a differential value of the current $i_{p1p2\_k}$, $$\frac{d(i_{p1\_k}+k_L \cdot 3i_{0\_k})}{dt}$$

represents a differential value of the value $i_{p1\_k}+k_L\cdot3i_{0\_k}$, $R_0$ represents a zero sequence resistance of the three-phase transmission line, $R_1$ represents a positive sequence resistance of the three-phase transmission line, $L_0$ represents a zero sequence inductance of the three-phase transmission line, $L_1$ represents a positive sequence inductance of the three-phase transmission line, and $i_{0\_k}$ represents a zero sequence current at instant k;

compare the instantaneous measurement point voltage value and the instantaneous comparison voltage value specified by the operation criterion of the protection device; and trip the electrical line based on a result of the comparison of the instantaneous measurement point voltage value and the instantaneous comparison voltage value specified by the operation criterion of the protection device indicating a fault on the electrical line.

17. The system according to claim 16, wherein the instantaneous measurement point voltage value is calculated by:

$$u_{q\_k} = m_1 \cdot u_k + m_2 \cdot \left(R \cdot i_k + L \cdot \frac{di_k}{dt}\right)$$

wherein $u_{q\_k}$ represents the instantaneous measurement point voltage value at instant k, $u_k$ represents the sampled value of the voltage at instant k, $i_k$ represents the sampled value of the current at instant k, R and L, respectively, represent the resistance value of the resistor and the inductance value of the inductor in the time-domain lumped parameter model, $$\frac{di_k}{dt}$$

represents a differential value of the current $i_k$, and $m_1$ and $m_2$ are coefficients specified by the operation criterion of the protection device.

18. The system according to claim 16, wherein the instantaneous measurement point voltage value is calculated by:

$$\begin{cases} u_{q\_p1p2\_k} = u_{p1p2\_k} - \left(R \cdot i_{p1p2\_k} + L \cdot \frac{di_{p1p2\_k}}{dt}\right) \\ u_{q\_p1\_k} = u_{p1\_k} - \left[R \cdot (i_{p1\_k}+k_R \cdot 3i_{0\_k}) + L \cdot \frac{d(i_{p1\_k}+k_L \cdot 3i_{0\_k})}{dt}\right] \\ k_R = \frac{R_0 - R_1}{3R_1} \\ k_L = \frac{L_0 - L_1}{3L_1} \end{cases}$$

wherein p1 and p2 represent the first and second phases, respectively, of the three-phase transmission line of the power transmission system, $u_{q\_p1p2\_k}$ represents the instantaneous measurement point voltage value between phase p1 and phase p2 at instant k, $u_{q\_p1\_k}$ represents the instantaneous measurement point voltage value of phase p1 at instant k, $u_{p1p2\_k}$, $i_{p1p2\_k}$, respectively, represent the sampled value of the voltage and the sampled value of the current between phase p1 and phase p2 at the measurement point at instant k, $u_{p1\_k}$, $i_{p1\_k}$, respectively, represent the sampled value of the voltage and sampled value of the current of phase p1 at the measurement point at instant k, R and L, respectively, represent the resistance value of the resistor and the inductance value of the inductor in the time-domain lumped parameter model, $$\frac{di_{p1p2\_k}}{dt}$$

represents the differential value of the current $i_{p1p2\_k}$, $$\frac{d(i_{p1\_k}+k_L \cdot 3i_{0\_k})}{dt}$$

represents the differential value of the value $i_{p1\_k}+k_L\cdot3i_{0\_k}$, $R_0$ represents the zero sequence resistance of the three-phase transmission line, $R_1$ represents the positive sequence resistance of the three-phase transmission line, $L_0$ represents the zero sequence inductance of the three-phase transmission line, $L_1$ represents the positive sequence inductance of the three-phase transmission line, and $i_{0\_k}$ represents the zero sequence current at instant k.

19. The system according to claim 16, wherein the time-domain lumped parameter model comprises any of a Resistor-Inductor-Capacitor (RLC) model or a Resistor-Inductor (RL) model.

20. The system according to claim 16, wherein calculating the instantaneous measurement point voltage value comprises:

determining the instantaneous measurement point voltage value between the first phase and the second phase of the three-phase transmission line of the power transmission system, based on:
the sampled value of the voltage between the first and second phases at the measurement point;
the sampled value of the current between the first and second phases at the measurement point;
the resistance value of the resistor and the inductance value of the inductor in the time-domain lumped parameter model; and
a differential value of the sampled value of the current between the first and second phases at the measurement point; and determining the instantaneous measurement point voltage value of the first phase based on:
  the sampled value of the voltage of the first phase at the measurement point;
  the sampled value of the current of the first phase at the measurement point;
  the resistance value of the resistor and the inductance value of the inductor in the time-domain lumped parameter model;
  a proportion of zero and positive sequence resistances of the three-phase transmission line;
  a zero sequence current; and
  a differential value of a combination of the sampled value of the current of the first phase at the measurement point, a proportion of zero and positive sequence inductances of the three-phase transmission line, and the zero sequence current.

* * * * *

UNITED STATES PATENT AND TRADEMARK OFFICE
CERTIFICATE OF CORRECTION

PATENT NO. : 11,885,843 B2  
APPLICATION NO. : 16/440258  
DATED : January 30, 2024  
INVENTOR(S) : Kai Liu Page 1 of 3

It is certified that error appears in the above-identified patent and that said Letters Patent is hereby corrected as shown below:

In the Claims

In Column 24, in Claim 1, Line 40, after "$i_{p1p2\_k}$" insert -- , --.

In Column 25, in Claim 3, Lines 49-57, delete

"$$\begin{cases} u_{q\_p1p2\_k} = u_{p1p2\_k} - \left(R \cdot i_{p1p2\_k} + L \cdot \frac{di_{p1p2\_k}}{dt}\right) \\ u_{q\_p1\_k} = u_{p1\_k} - \left[R \cdot (i_{p1\_k} + k_R \cdot 3i_{0\_k}) + L \cdot \frac{d(i_{p1\_k} + k_L \cdot 3i_{0\_k})}{dt}\right] \\ k_R = \frac{R_0 - R_1}{3R_1} \\ k_L = \frac{L_0 - L_1}{3L_1} \end{cases}$$" and insert $$\begin{cases} u_{res\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$ --.

In Column 27, in Claim 6, Line 7, after "wherein" delete "calculating".

Signed and Sealed this  
Twenty-first Day of May, 2024

Katherine Kelly Vidal  
*Director of the United States Patent and Trademark Office*

In Column 27, in Claim 6, Lines 11-19, delete

"$$\begin{cases} u_{res\_p1p2\_k} = R \cdot i_{p1p2\_k} + L \cdot \frac{di_{p1p2\_k}}{dt} \\ u_{res\_p1\_k} = R \cdot (i_{p1\_k} + k_R \cdot 3i_{0\_k}) + L \cdot \frac{d(i_{p1\_k} + k_L \cdot 3i_{0\_k})}{dt} \\ k_R = \frac{R_0 - R_1}{3R_1} \\ k_L = \frac{L_0 - L_1}{3L_1} \end{cases}$$" and insert --$$\begin{cases} u_{q\_p1p2\_k} = u_{p1p2\_k} - (R \cdot i_{p1p2\_k} + L \cdot \frac{di_{p1p2\_k}}{dt}) \\ u_{q\_p1\_k} = u_{p1\_k} - [R \cdot (i_{p1\_k} + k_R \cdot 3i_{0\_k}) + L \cdot \frac{d(i_{p1\_k} + k_L \cdot 3i_{0\_k})}{dt}] \\ k_R = \frac{R_0 - R_1}{3R_1} \\ k_L = \frac{L_0 - L_1}{3L_1} \end{cases}$$--.

In Column 28, in Claim 7, Line 11, delete "$u_{q\_k} = m_1 \cdot u_k + m_2 \cdot \left(R \cdot i_k + L \cdot \frac{di_k}{dt}\right)$,"

and insert -- $u_{res\_k} = m_3 \cdot u_k + m_4 \cdot (R \cdot i_k + L \cdot \frac{di_k}{dt})$ --.

In Column 28, in Claim 7, Line 28, delete "m₃and m₄are" and insert -- $m_3$ and $m_4$ are --.

In Column 29, in Claim 10, Line 13, delete "claim 9," and insert -- claim 6, --.

In Column 30, in Claim 11, Lines 1-10, delete

"$$\begin{cases} u_{q\_p1p2\_k} = u_{p1p2\_k} - \left(R \cdot i_{p1p2\_k} + L \cdot \frac{di_{p1p2\_k}}{dt}\right) \\ u_{q\_p1\_k} = u_{p1\_k} - \left[R \cdot (i_{p1\_k} + k_R \cdot 3i_{0\_k}) + L \cdot \frac{d(i_{p1\_k} + k_L \cdot 3i_{0\_k})}{dt}\right] \\ k_R = \frac{R_0 - R_1}{3R_1} \\ k_L = \frac{L_0 - L_1}{3L_1} \end{cases}$$" and insert

CERTIFICATE OF CORRECTION (continued)
U.S. Pat. No. 11,885,843 B2

$$-- \begin{cases} u_{res\_p1p2\_k} = R \cdot i_{p1p2\_k} + L \cdot \dfrac{di_{p1p2\_k}}{dt} \\ u_{res\_p1\_k} = R \cdot (i_{p1\_k} + k_R \cdot 3i_{0\_k}) + L \cdot \dfrac{d(i_{p1\_k} + k_L \cdot 3i_{0\_k})}{dt} \\ k_R = \dfrac{R_0 - R_1}{3R_1} \\ k_L = \dfrac{L_0 - L_1}{3L_1} \end{cases} --.$$

In Column 30, in Claim 11, Line 37, after "of the" insert -- value --.

In Column 30, in Claim 12, Line 60, delete "$u_{q\_k}=m_1 \cdot u_k - m_2 \cdot (R \cdot i_k = L \cdot di_k/dt)$" and insert $$-- u_{q\_k} = m_1 \cdot u_k + m_2 \cdot (R \cdot i_k + L \cdot \dfrac{di_k}{dt}) --.$$

In Column 31, in Claim 13, Lines 12-20, delete $$" \begin{cases} u_{res\_p1p2\_k} = R \cdot i_{p1p2\_k} + L \cdot \dfrac{di_{p1p2\_k}}{dt} \\ u_{res\_p1\_k} = R \cdot (i_{p1\_k} + k_R \cdot 3i_{0\_k}) + L \cdot \dfrac{d(i_{p1\_k} + k_L \cdot 3i_{0\_k})}{dt} \\ k_R = \dfrac{R_0 - R_1}{3R_1} \\ k_L = \dfrac{L_0 - L_1}{3L_1} \end{cases} "$$

and insert $$-- \begin{cases} u_{q\_p1p2\_k} = u_{p1p2\_k} - (R \cdot i_{p1p2\_k} + L \cdot \dfrac{di_{p1p2\_k}}{dt}) \\ u_{q\_p1\_k} = u_{p1\_k} - [R \cdot (i_{p1\_k} + k_R \cdot 3i_{0\_k}) + L \cdot \dfrac{d(i_{p1\_k} + k_L \cdot 3i_{0\_k})}{dt}] \\ k_R = \dfrac{R_0 - R_1}{3R_1} \\ k_L = \dfrac{L_0 - L_1}{3L_1} \end{cases} --.$$